US012374623B2

United States Patent
Park et al.

(10) Patent No.: US 12,374,623 B2
(45) Date of Patent: Jul. 29, 2025

(54) STACKED SEMICONDUCTOR DEVICE ARCHITECTURE

(71) Applicant: SAMSUNG ELECTRONICS CO., LTD., Suwon-si (KR)

(72) Inventors: Saehan Park, Clifton Park, NY (US); Seungyoung Lee, Clifton Park, NY (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 1018 days.

(21) Appl. No.: 17/220,643

(22) Filed: Apr. 1, 2021

(65) Prior Publication Data

US 2022/0230961 A1 Jul. 21, 2022

Related U.S. Application Data

(60) Provisional application No. 63/138,596, filed on Jan. 18, 2021.

(51) Int. Cl.
*H01L 23/528* (2006.01)
(52) U.S. Cl.
CPC ................ *H01L 23/5286* (2013.01)
(58) Field of Classification Search
CPC ............ H01L 27/0922; H01L 23/5286; H01L 27/092; H01L 27/0688
See application file for complete search history.

(56) References Cited

U.S. PATENT DOCUMENTS

| 9,640,531 | B1 | 5/2017 | Or-Bach et al. |
| 10,325,821 | B1 | 6/2019 | Hook et al. |
| 10,607,938 | B1 | 3/2020 | Rubin et al. |
| 10,770,479 | B2 | 9/2020 | Smith et al. |
| 10,811,415 | B2 | 10/2020 | Sengupta et al. |
| 2020/0135718 | A1 | 4/2020 | Liebmann et al. |
| 2020/0203276 | A1 | 6/2020 | Hiblot et al. |
| 2020/0266169 | A1 | 8/2020 | Kang et al. |
| 2020/0328212 | A1 | 10/2020 | Wu et al. |
| 2020/0381430 | A1 | 12/2020 | Liebmann et al. |

OTHER PUBLICATIONS

Communication dated Apr. 12, 2022 issued by the European Patent Office in application No. 21207095.7.
Spessot, A., et al., "Device Scaling roadmap and its implications for Logic and Analog platform", 2020 IEEE Bicmos and Compound Semiconductor Integrated Circuits and Technology Symposium, Nov. 16, 2020, XP033896719, 8 pages.

*Primary Examiner* — Anthony Ho
(74) *Attorney, Agent, or Firm* — Sughrue Mion, PLLC

(57) ABSTRACT

Provided is a semiconductor architecture having a metal-oxide-semiconductor field-effect transistor (MOSFET) cell, the semiconductor architecture including a first semiconductor device included in the MOSFET cell, a second semiconductor device included in the MOSFET cell, the second semiconductor device being provided above the first semiconductor device, a first power rail configured to supply power to the first semiconductor device, the first power rail being provided at a vertical level different from the first semiconductor device and the second semiconductor device, and a second power rail configured to supply power to the second semiconductor device, the second power rail being provided at a vertical level between the first semiconductor device and the second semiconductor device.

18 Claims, 13 Drawing Sheets

STACKED SEMICONDUCTOR DEVICE ARCHITECTURE

CROSS-REFERENCE TO THE RELATED APPLICATION

This application is based on and claims benefit to U.S. Provisional Application No. 63/138,596 filed on Jan. 18, 2021 in the U.S. Patent and Trademark Office, the disclosure of which is incorporated herein in its entirety by reference.

BACKGROUND

1. Field

Example embodiments of the present disclosure relate to a stacked semiconductor device architecture and a method of manufacturing the same, and more particularly to a stacked semiconductor device architecture including a power rail provided between the stacked semiconductor devices and a method of manufacturing the same.

2. Description of Related Art

Generally, a non-stacked semiconductor device architecture requires a large area due to a p-type metal-oxide semiconductor (PMOS) devices and an n-type metal-oxide semiconductor (NMOS) devices being provided on a same plane. In addition, in a non-stacked semiconductor device architecture, power rails connected to the PMOS device and the NMOS device are both provided above or below the PMOS device and the NMOS device. Technologies to reduce a total area of a semiconductor architecture have been developed. For example, stacked semiconductor device architecture in which a PMOS device and an NMOS device in a metal-oxide-semiconductor field-effect transistor (MOSFET) based cell are stacked in a vertical direction has been developed.

However, in a related stacked semiconductor device architecture, power rails are provided above the stacked PMOS device and NMOS device, or power rails are buried in a substrate that is provided below the stacked PMOS device and NMOS device. Accordingly, a height of a vertical contact that connects one of the PMOS device or the NMOS device that is provided at a vertical distance further away from the power rail increases. An increase in a height of the vertical contact increases a resistance of the power connection in the stacked semiconductor device architecture. Accordingly, a degradation in performance of the stacked semiconductor device architecture may occur.

Information disclosed in this Background section has already been known to the inventors before achieving the embodiments of the present application or is technical information acquired in the process of achieving the embodiments. Therefore, it may contain information that does not form the prior art that is already known to the public.

SUMMARY

One or more example embodiments provide a stacked semiconductor device architecture and a method of manufacturing the same.

One or more example embodiments also provide a stacked semiconductor device architecture including a power rail provided between the semiconductor devices, and a method of manufacturing the same.

According to an aspect of an example embodiment, there is provided a semiconductor architecture having a metal-oxide-semiconductor field-effect transistor (MOSFET) cell, the semiconductor architecture including a substrate, a first semiconductor device provided on the substrate, a second semiconductor device provided on the substrate, the second semiconductor device being provided below the first semiconductor device, a first power rail configured to supply power to the first semiconductor device, and a second power rail configured to supply power to the second semiconductor device, wherein the first semiconductor device and the second semiconductor device are included in the MOSFET cell, wherein at least one of the first power rail and the second power rail is provided at a vertical level between the first semiconductor device and the second semiconductor device.

According to another aspect of an example embodiment, there is provided a semiconductor architecture having a metal-oxide-semiconductor field-effect transistor (MOSFET) cell, the semiconductor architecture including a wafer, a p-type metal-oxide semiconductor (PMOS) device provided on the wafer, an n-type metal-oxide semiconductor (NMOS) device provided at a vertical level different from the PMOS device on the wafer, a first power rail configured to supply power to the PMOS device, and a second power rail configured to supply power to the NMOS device, wherein the PMOS device and the NMOS device are included in the MOSFET cell, and wherein at least one of the first power rail and the second power rail is provided at a vertical level between the PMOS device and the NMOS device.

According to another aspect of an example embodiment, there is provided a semiconductor architecture having a metal-oxide-semiconductor field-effect transistor (MOSFET) cell, the semiconductor architecture including a first semiconductor device included in the MOSFET cell, a second semiconductor device included in the MOSFET cell, the second semiconductor device being provided above the first semiconductor device, a first power rail configured to supply power to the first semiconductor device, the first power rail being provided a vertical level between the first semiconductor device and the second semiconductor device, and a second power rail configured to supply power to the second semiconductor device, the second power rail being provided at a vertical level different from the first semiconductor device and the second semiconductor device.

BRIEF DESCRIPTION OF THE DRAWINGS

The above and/or other aspects, features, and advantages of example embodiments of the disclosure will be more apparent from the following description taken in conjunction with the accompanying drawings, in which.

DETAILED DESCRIPTION

Figure 1A:
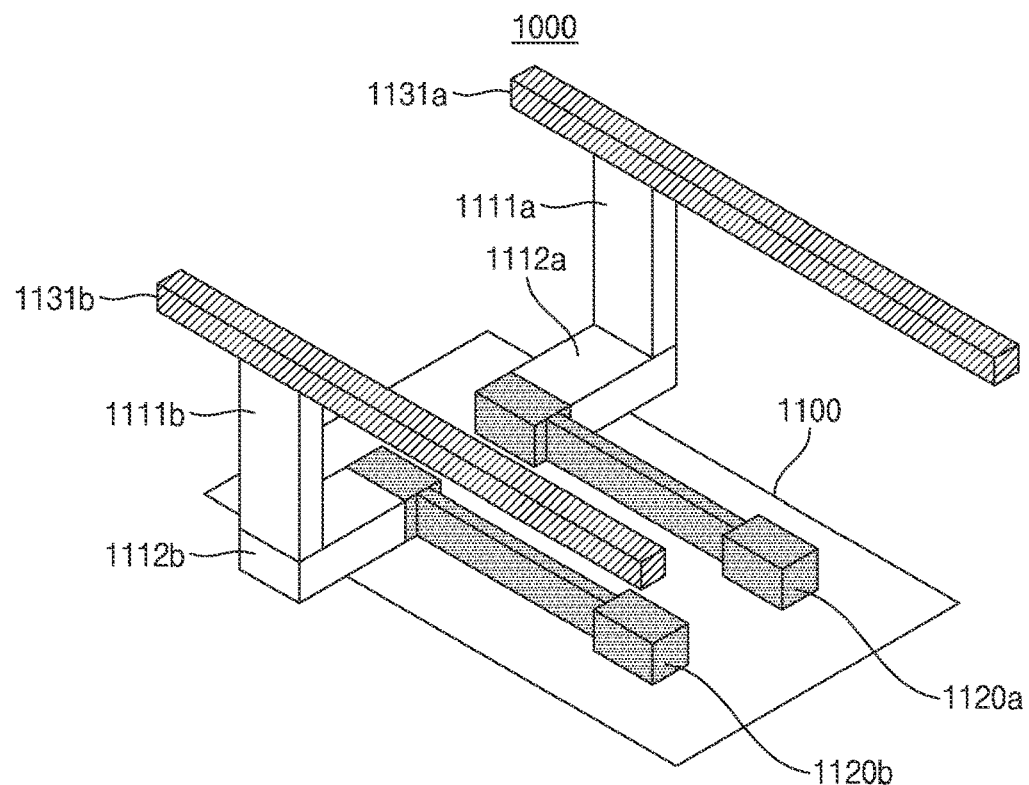
FIGS. 1A and 1B illustrate perspective views of general non-stacked semiconductor device architectures.

The example embodiments described herein are examples, and thus, the present disclosure is not limited thereto, and may be realized in various other forms. Each of the example embodiments provided in the following description is not excluded from being associated with one or more features of another example or another example embodiment also provided herein or not provided herein but consistent with the present disclosure. For example, even if matters described in a specific example or example embodiment are not described in a different example or example embodiment thereto, the matters may be understood as being related to or combined with the different example or embodiment, unless otherwise mentioned in descriptions thereof.

In addition, it should be understood that all descriptions of principles, aspects, examples, and example embodiments are intended to encompass structural and functional equivalents thereof. In addition, these equivalents should be understood as including not only currently well-known equivalents but also equivalents to be developed in the future, that is, all devices invented to perform the same functions regardless of the structures thereof.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," "top," and "bottom," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. Herein, when a term "same" is used to compare a dimension of two or more elements, the term may cover a "substantially same" dimension.

It will be understood that, although the terms "first," "second," "third," "fourth," etc. may be used herein to describe various elements, these elements should not be limited by these terms. These terms are only used to distinguish one element from another element. Thus, a first element discussed below could be termed a second element without departing from the teachings of the present disclosure.

It will be also understood that, even if a certain step or operation of manufacturing an apparatus or structure is described later than another step or operation, the step or operation may be performed later than the other step or operation unless the other step or operation is described as being performed after the step or operation.

Example embodiments are described herein with reference to cross-sectional illustrations that are schematic illustrations of the example embodiments (and intermediate structures). As such, variations from the shapes of the illustrations as a result, for example, of manufacturing techniques and/or tolerances, are to be expected. Thus, the example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosure. Further, in the drawings, the sizes and relative sizes of layers and regions may be exaggerated for clarity.

For the sake of brevity, general elements to semiconductor devices may or may not be described in detail herein.

Figure 1B:
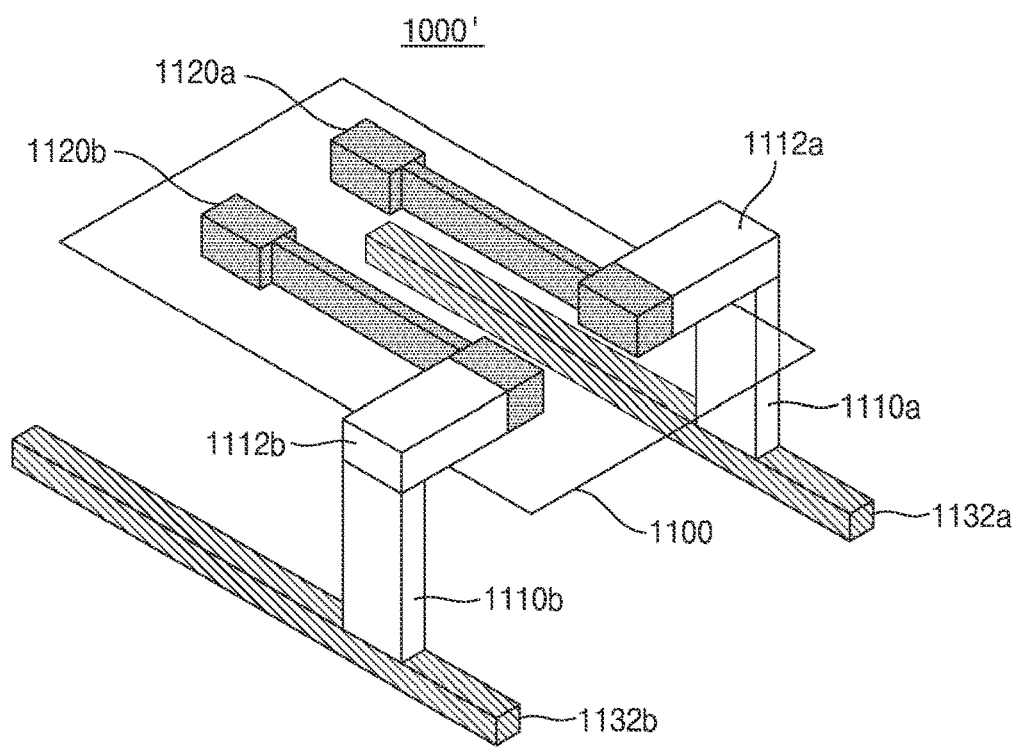

FIGS. 1A and 1B illustrate perspective views of general non-stacked semiconductor device architectures.

Referring to FIG. 1A, a non-stacked semiconductor architecture 1000 may include a metal-oxide-semiconductor field-effect transistor (MOSFET) based cell including a PMOS device 1120a and an NMOS device 1120b provided on a same plane of a substrate 1100. The substrate 1100 may be a wafer including silicon (Si). A horizontal interconnect 1112a may be connected to the PMOS 1120a. The horizontal interconnect 1112a may be connected to an epitaxial layer of the PMOS 1120a. A top vertical contact 1111a may be provided on the horizontal interconnect 1112a and extend upwards. A top power rail 1131a configured to supply power to the PMOS 1120a may be provided on the top vertical contact 1111a. The top power rail 1131a may be provided above the PMOS 1120a in a vertical direction and spaced apart from the PMOS 1120a in a horizontal direction.

Similarly, a horizontal interconnect 1112b is connected to the NMOS 1120b. The horizontal interconnect 1112b may be connected to an epitaxial layer of the NMOS 1120b. A top vertical contact 1111b may be provided on the horizontal interconnect 1112b and extend upwards. Another top power rail 1131b configured supply power to the NMOS 1120b may be provided on the top vertical contact 1111b. The top power rail 1131b may be provided above the NMOS 1120b in a vertical direction and spaced apart from the NMOS 1120b in a horizontal direction.

Referring to FIG. 1B, a non-stacked semiconductor architecture 1000' may include a MOSFET cell including a PMOS 1120a and an NMOS 1120b provided on a same plane of a substrate 1100. A horizontal interconnect 1112a may be connected to the PMOS 1120a. The horizontal interconnect 1112a may be connected to an epitaxial layer of the PMOS 1120a. A bottom vertical contact 1110a may be provided on the horizontal interconnect 1112a and extend downwards. A bottom power rail 1132a configured to supply power to the PMOS 1120a may be provided on the bottom vertical contact 1110a. The bottom power rail 1132a may be provided below the PMOS 1120a in a vertical direction and spaced apart from the PMOS 1120a in a horizontal direction.

Similarly, a horizontal interconnect 1112b is connected to the NMOS 1120b. The horizontal interconnect 1112b may be connected to an epitaxial layer of the NMOS 1120b. A bottom vertical contact 1110b may be provided on the horizontal interconnect 1112b and extend downwards. Another bottom power rail 1132b configured to supply power to the NMOS 1120b may be provided on the bottom vertical contact 1110b. The bottom power rail 1132b may be provided below the NMOS 1120b in a vertical direction and spaced apart from the NMOS 1120b in a horizontal direction.

Figure 2A:
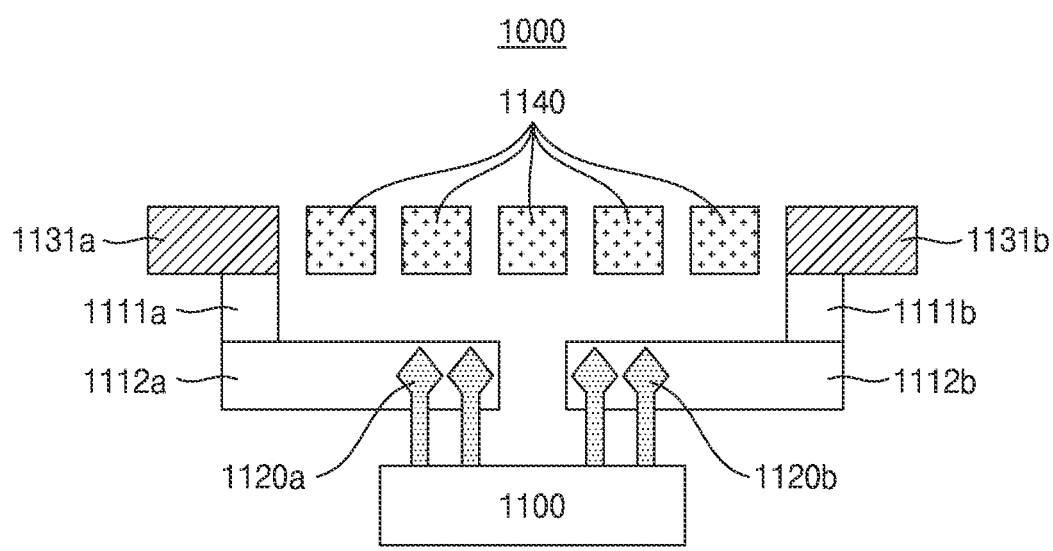
FIG. 2A illustrates a cross-sectional view of the non-stacked semiconductor device architecture as illustrated in FIG. 1A.
Figure 2B:
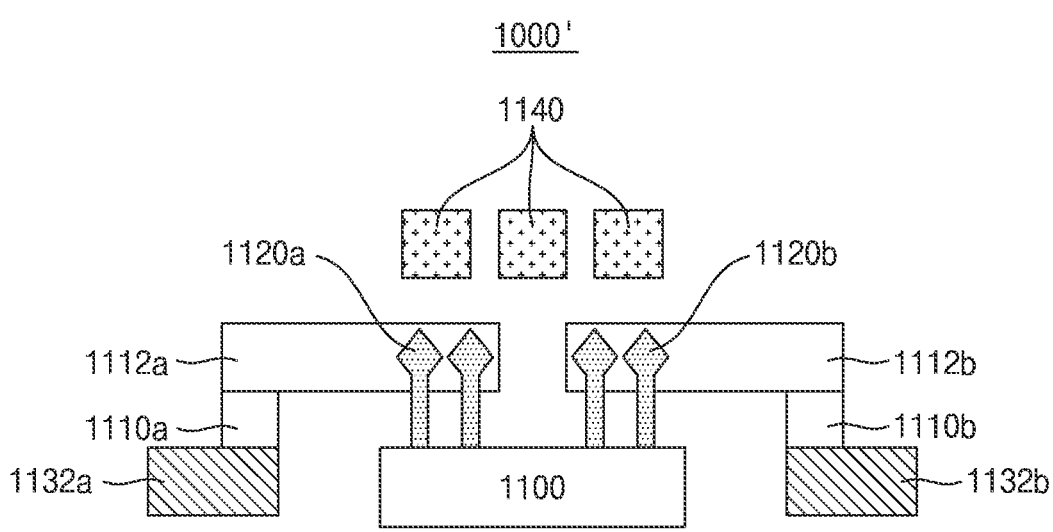
FIG. 2B illustrates a cross-sectional view of the non-stacked semiconductor device architecture as illustrated in FIG. 1B.

FIG. 2A illustrates a cross-sectional view of the non-stacked semiconductor device architecture as illustrated in FIG. 1A, and FIG. 2B illustrates a non-stacked semiconductor device architecture as illustrated in FIG. 1B.

Referring to FIG. 2A, in the MOSFET cell, a PMOS 1120a and an NMOS 1120b are provided on a same plane of a substrate 1100. Horizontal interconnects 1112a and 1112b are connected to an epitaxial layer of the PMOS 1120a and an epitaxial layer of the NMOS 1120b, respectively. The horizontal interconnects 1112a and 1112b may extend in a horizontal direction away from the PMOS 1120a and the NMOS 1120b. Top vertical contacts 1111a and 1111b are provided on the horizontal interconnects 1112a and 1112b, respectively, and top power rails 1131a and 1131b are provided on the top vertical contacts 1111a and 1111b at a vertical level above the PMOS 1120a and the NMOS 1120b. In addition, metal layers 1140 configured to route signals may be provided between the top power rails 1131a and 1131b on a same vertical level as the top power rails 1131a and 1131b.

Referring to FIG. 2B, in the MOSFET cell, a PMOS 1120a and an NMOS 1120b are provided on a same plane of a substrate 1100. Horizontal interconnects 1112a and 1112b are connected to an epitaxial layer of the PMOS 1120a and an epitaxial layer of the NMOS 1120b, respectively. The horizontal interconnects 1112a and 1112b may extend in a horizontal direction away from the PMOS 1120a and the NMOS 1120b. Bottom vertical contacts 1110a and 1110b may be provided on the horizontal interconnects 1112a and 1112b, respectively, and extend downwards. Bottom power rails 1132a and 1132b are provided on a lower surface of the bottom vertical contacts 1110a and 1110b, respectively, at a vertical level below the PMOS 1120a and the NMOS 1120b. In addition, metal layers 1140 configured to route signals may be provided above the PMOS 1120a and the NMOS 1120b in a vertical direction.

As illustrated in FIGS. 2A and 2B, as the PMOS 1120a and the NMOS 1120b are provided on a same plane, a total area of the non-stacked semiconductor device architectures 1000 and 1000' may be relatively large in a horizontal direction, resulting in an increased area and size of the non-stacked semiconductor device architectures 1000 and 1000'.

Figure 3:
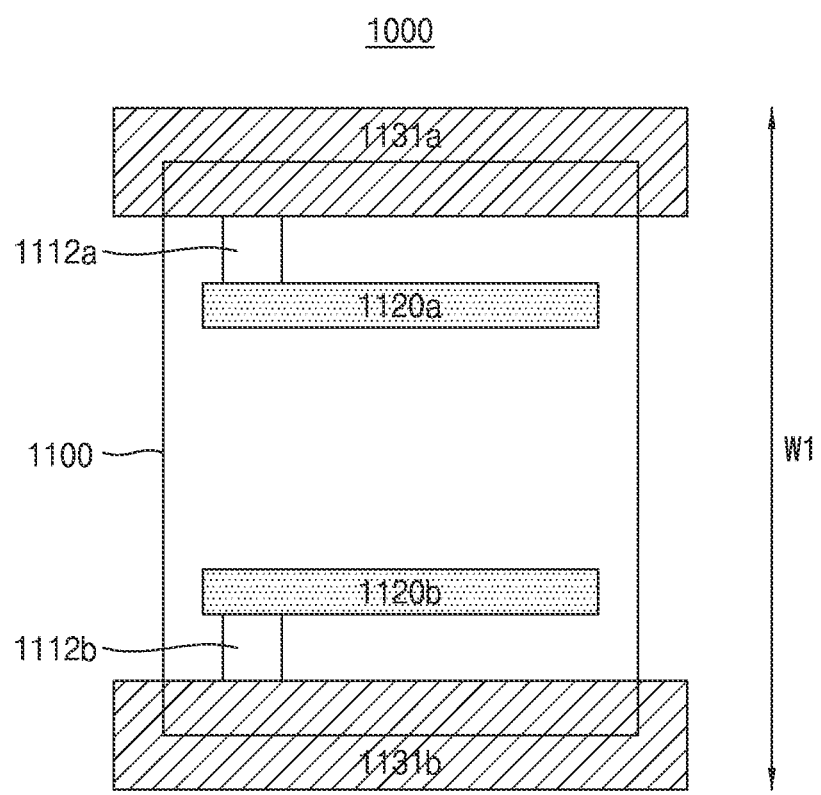
FIG. 3 illustrates a top plan view of the non-stacked semiconductor device architecture as illustrated in FIG. 1A.

FIG. 3 illustrates a top plan view of the non-stack semiconductor device architecture as illustrated in FIG. 1A.

Referring to FIG. 3, a width W1 of the MOSFET cell of the non-stack semiconductor device architecture is relatively large because the PMOS 120a and NMOS 120b are provided on a same plane. Thus, a size of the non-stack semiconductor device architecture may increase.

Figure 4A:
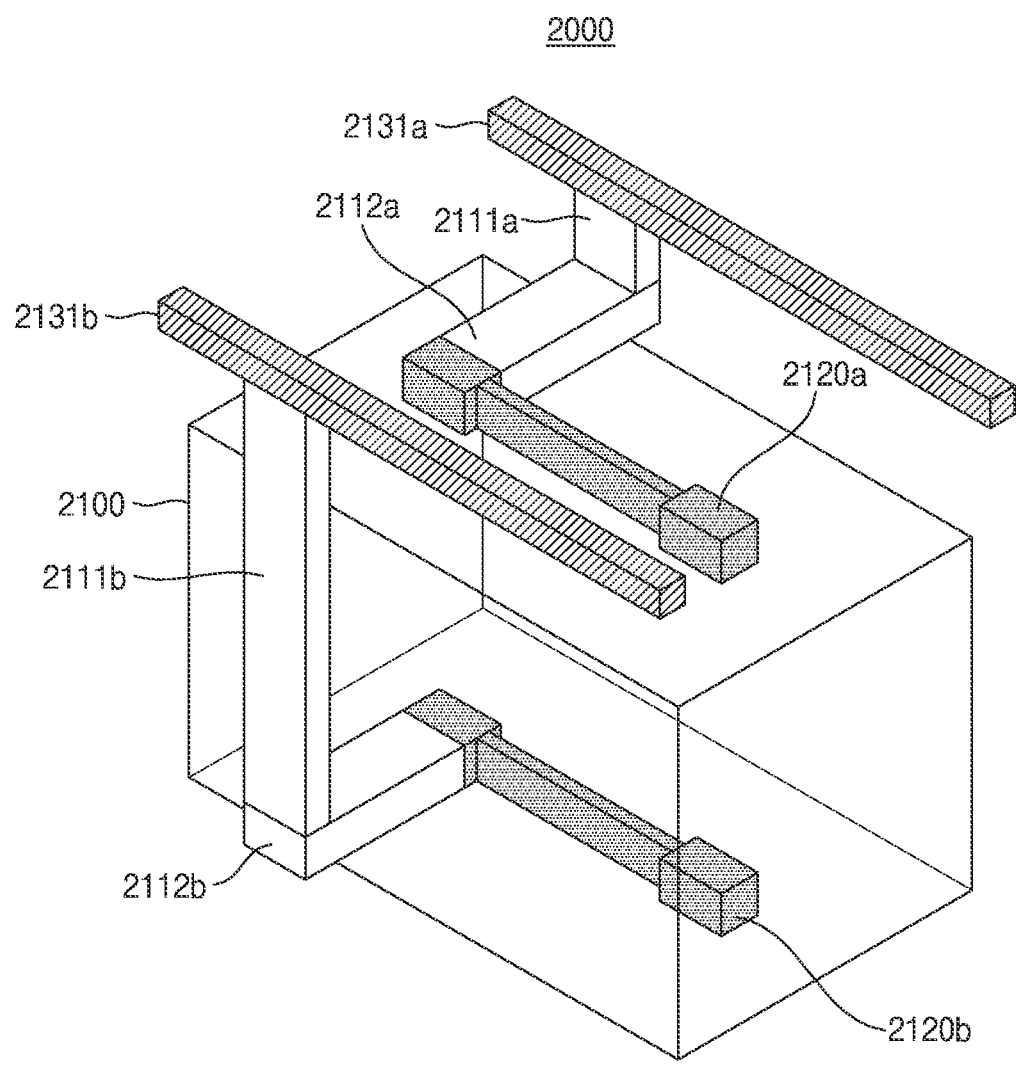
FIGS. 4A and 4B illustrate stacked semiconductor device architectures according to related embodiments.
Figure 4B:
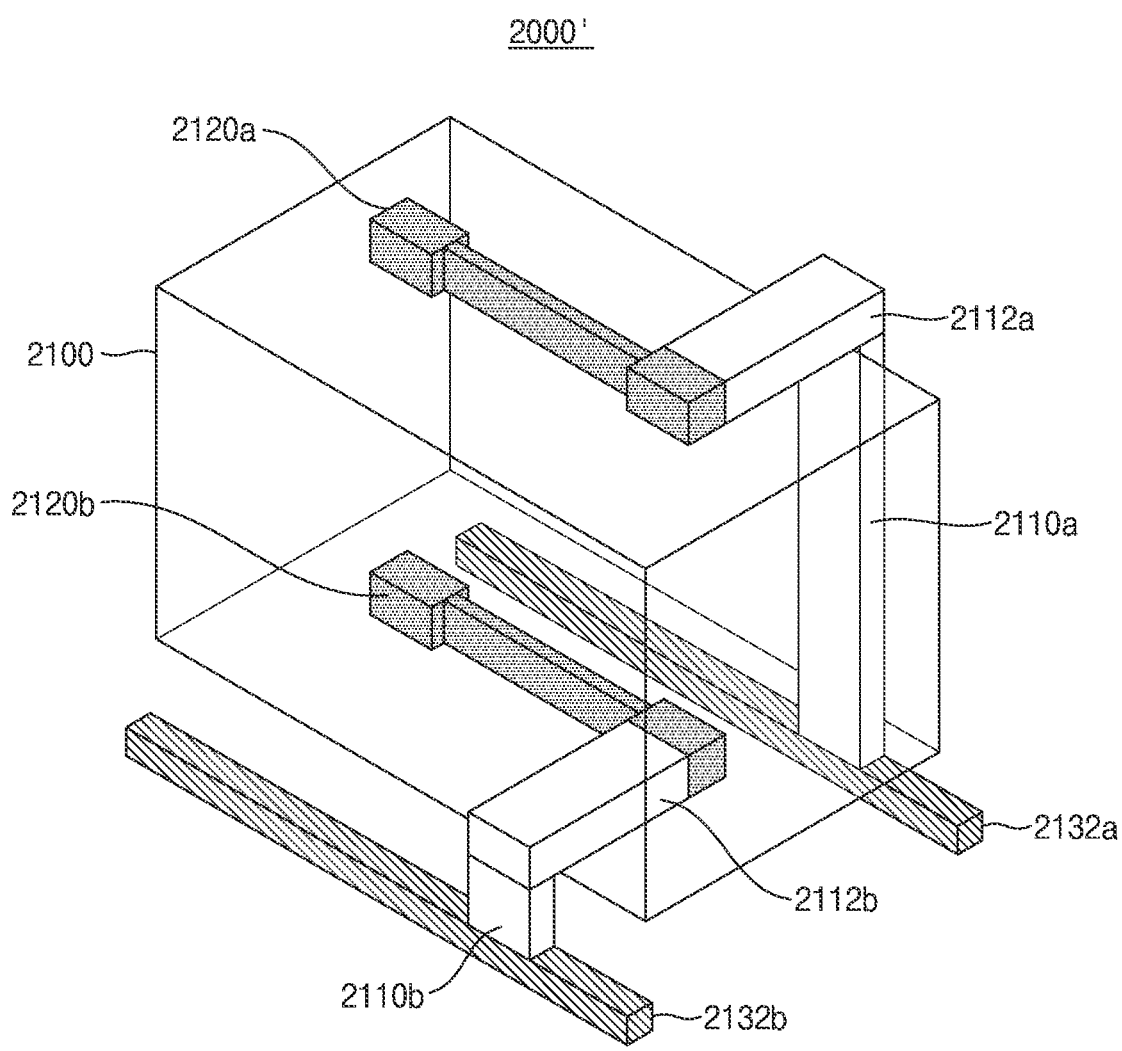

FIGS. 4A and 4B illustrate stacked semiconductor device architectures according to related embodiments.

Referring to FIG. 4A, a stacked semiconductor device architecture 2000 according to a related embodiment includes a MOSFET cell including a PMOS 2120a provided on a first level of a substrate 2100 and an NMOS 2120b provided below the PMOS 2120a on a second level of the substrate 2100. The NMOS 2120b may be provided on a first level of a substrate 2100 and the PMOS 2120a may be provided below the NMOS 2120b on a second level of the substrate 2100. A horizontal interconnect 2112a is connected to the PMOS 2120a. The horizontal interconnect 2112a may be connected to an epitaxial layer of the PMOS 2120a. A top vertical contact 2111a may be provided on the horizontal interconnect 2112a and extend upwards to a vertical level above the PMOS 2120a. A top power rail 2131a configured to supply power to the PMOS 2120a is provided on an upper surface of the top vertical contact 2111a. The top power rail 2131a may be provided above the PMOS 2120a and the NMOS 2120b in a vertical direction.

The NMOS 2120b is connected to a horizontal interconnect 2112b. The horizontal interconnect 2112b may be connected to an epitaxial layer of the NMOS 2120b. A top vertical contact 2111b is connected to the horizontal interconnect 2112b. A top power rail 2131b is provided on an upper surface of the top vertical contact 2111b above the PMOS 2120a and the NMOS 2120b in a vertical direction.

As illustrated in FIG. 4A, a height of the top vertical contact 2111b is increased compared to top vertical contacts 1111a and 1111b and bottom vertical contacts 1110a and 1110b as illustrated in FIGS. 1A and 1B, which increases an aspect ratio of the top vertical contact 2111b. Accordingly, a resistance may increase which may lead to a degradation in the performance of the stacked semiconductor device architecture 2000.

Referring to FIG. 4B, a stacked semiconductor device architecture 2000' according to another related embodiment includes a MOSFET cell including a PMOS 2120a provided on a first level of a substrate 2100 and an NMOS 2120b is provided below the PMOS 2120a on a second level of the substrate 2100. A horizontal interconnect 2112a is connected to the PMOS 2120a. The horizontal interconnect 2112a may be connected to an epitaxial layer of the PMOS 2120a. A bottom vertical contact 2110a is provided on the horizontal interconnect 2112a and extends downwards to a vertical level below the NMOS 2120b. A bottom power rail 2132a configured to supply power to the PMOS 2120a is provided on a lower surface of the bottom vertical contact 2110a. The bottom power rail 2132a may be provided at a vertical level below the PMOS 2120a and the NMOS 2120b. The bottom power rail 2132a may be a buried power rail that is buried in the substrate 2100.

The NMOS 2120b is connected to a horizontal interconnect 2112b. The horizontal interconnect 2112b may be connected to an epitaxial layer of the NMOS 2120b. A bottom vertical contact 2110b is connected to the horizontal interconnect 2112b and extends downwards. A bottom power rail 2132b is provided on a lower surface of the bottom vertical contact 2110b. The bottom power rail 2132b may be provided at a vertical level below the PMOS 2120a and the NMOS 2120b. The bottom power rail 2132b may be a buried power rail that is buried in the substrate 2100.

As illustrated in FIG. 4B, a height of the bottom vertical contact 2110a is increased compared to the top vertical contacts 1111a and 1111b and bottom vertical contacts 1110a and 1110b as illustrated in FIGS. 1A and 1B. Accordingly, an aspect ratio of the bottom vertical contact 2110a may increase and a resistance may increase leading to a degradation in the performance of the stacked semiconductor device architecture 2000'.

Figure 5A:
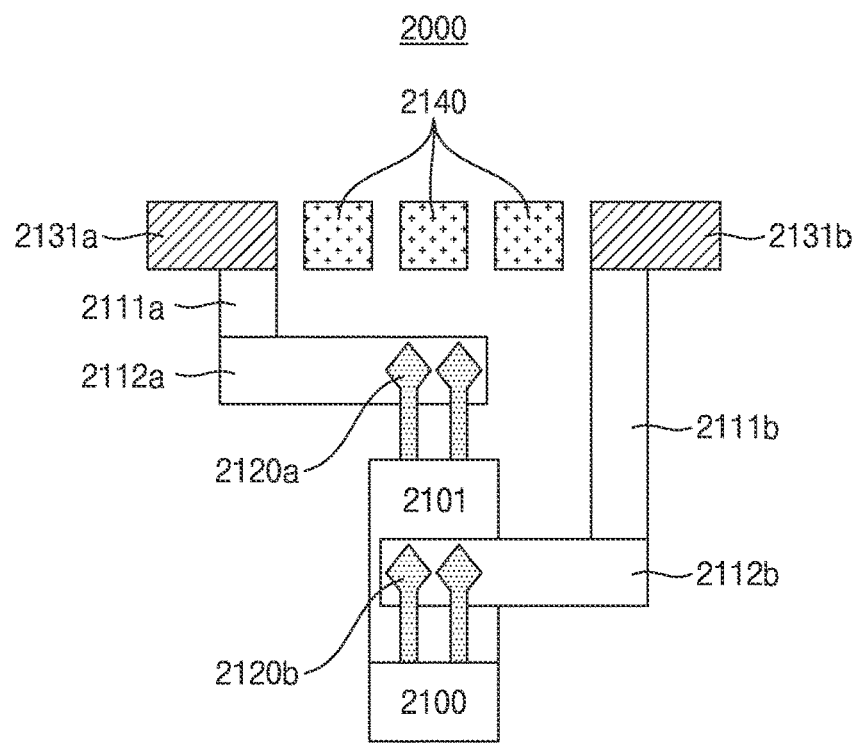
FIG. 5A is a cross-sectional view of the stacked semiconductor device architecture as illustrated in FIG. 4A.
Figure 5B:
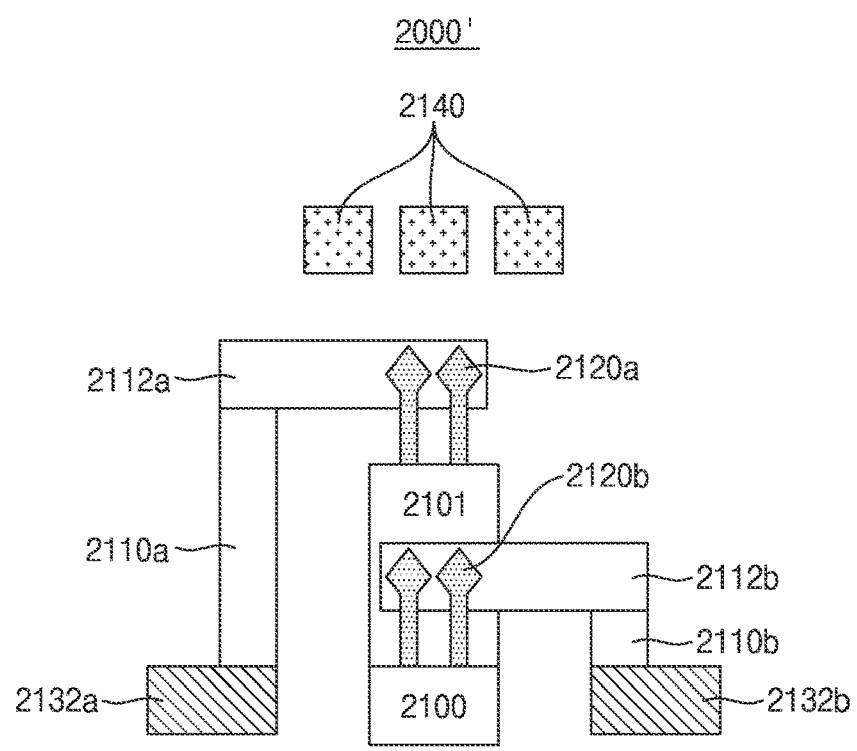
FIG. 5B is a cross-sectional view of the stacked semiconductor device architecture as illustrated in FIG. 4B.

FIG. 5A is a cross-sectional view of the stacked semiconductor device architecture as illustrated in FIG. 4A, and FIG. 5B is a cross-sectional view of the stacked semiconductor device architecture as illustrated in FIG. 4B.

Referring to FIG. 5A, a PMOS 2120a is provided on a first level of a substrate 2100 and an NMOS 2120b is provided below the PMOS 2120a on a second level of the substrate 2100. Dielectric material 2101 may be included between the PMOS 2120a and the NMOS 2120b. A horizontal interconnect 2112a is connected to the PMOS 2120a. The horizontal interconnect 2112a may be connected to an epitaxial layer of the PMOS 2120a. A top vertical contact 2111a is provided on the horizontal interconnect 2112a and extends upwards to a vertical level above the PMOS 2120a. A top power rail 2131a configured to supply power to the PMOS 2120a is provided on an upper surface of the top vertical contact 2111a. The top power rail 2131a is provided at a vertical level above the PMOS 2120a and the NMOS 2120b.

The NMOS 2120b is connected to a horizontal interconnect 2112b. The horizontal interconnect 2112b may be connected to an epitaxial layer of the NMOS 2120b. A top vertical contact 2111b is provided on the horizontal interconnect 2112b. A top power rail 2131b is provided on an upper surface of the top vertical contact 2111b at a vertical level above the PMOS 2120a and at a vertical level same as an adjacent top power rail 2131a.

In addition, metal layers 2140 configured to route signals may be provided between the adjacent top power rails 2131a and 2131b at a same vertical level.

As illustrated in FIG. 5A, a height of the top vertical contact 2111b is increased compared to top vertical contacts 1111a and 1111b and bottom vertical contacts 1110a and 1110b illustrated in FIGS. 2A and 2B. Accordingly, an aspect ratio of the top vertical contact 2111b may increase and a resistance may increase leading to a degradation in the performance of the stacked semiconductor device architecture 2000.

Referring to FIG. 5B, stacked semiconductor device architecture 2000' includes a PMOS 2120a is provided on a first level of a substrate 2100 and an NMOS 2120b is provided below the PMOS 2120a on a second level of the substrate 2100. Dielectric material 2101 may be included between the PMOS 2120a and the NMOS 2120b. A horizontal interconnect 2112a is connected to the PMOS 2120a. The horizontal interconnect 2112a may be connected to an epitaxial layer of the PMOS 2120a. A bottom vertical contact 2110a is provided on the horizontal interconnect 2112a and extends downwards to a vertical level below the NMOS 2120b. A bottom power rail 2132a configured to supply power to the PMOS 2120a is provided on a lower surface of the bottom vertical contact 2110a. The bottom power rail 2132a is provided at a vertical level below the PMOS 2120a and the NMOS 2120b.

The NMOS 2120b is connected to a horizontal interconnect 2112b. The horizontal interconnect 2112b may be connected to an epitaxial layer of the NMOS 2120b. A bottom vertical contact 2110b is connected to the horizontal interconnect 2112b and extends downwards. A bottom power rail 2132b is provided on a lower surface of the bottom vertical contact 2110b. The bottom power rail 2132b is provided at a vertical level below the PMOS 2120a and the NMOS 2120b.

In addition, metal layers 2140 configured to route signals may be provided above the PMOS 2120a and the NMOS 2120b.

As illustrated in FIG. 5B, a height of the bottom vertical contact 2110a is increased compared to top vertical contacts 1111a and 1111b and bottom vertical contacts 1110a and 1110b as illustrated in FIGS. 2A and 2B. Accordingly, an aspect ratio of the bottom vertical contact 2110a may increase and a resistance may increase leading to a degradation in the performance of the stacked semiconductor device architecture 2000'.

Figure 6A:
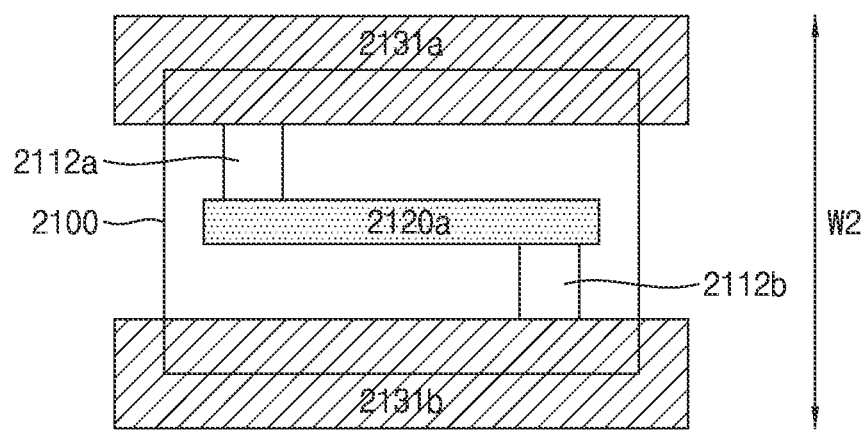
FIG. 6A is a top plan view of the stacked semiconductor device architecture as illustrated in FIG. 4A.
Figure 6B:
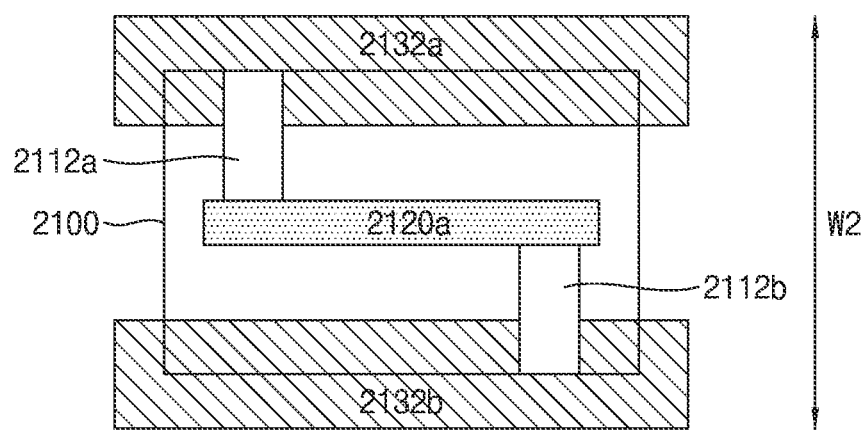
FIG. 6B is a top plan view of the stacked semiconductor device architecture as illustrated in FIG. 4B.

FIG. 6A is a top plan view of the stacked semiconductor device architecture as illustrated in FIG. 4A, and FIG. 6B is a top plan view of the stacked semiconductor device architecture as illustrated in FIG. 4B.

As illustrated in FIGS. 6A and 6B, as the PMOS 120a and the NMOS 120b are stacked in a vertical direction to overlap with each other, the width W2 of the MOSFET cell in the stacked semiconductor device architectures 2000 and 2000' may be reduced compared to the width W1 of a MOSFET cell in the non-stacked semiconductor device architecture 1000 as illustrated in FIG. 3. Accordingly, an area and a size of the semiconductor device architecture may be reduced.

However, due to the increased height of a vertical contact such as, for example, the top vertical contact 2111b as illustrated in FIG. 5A or the bottom vertical contact 2110a as illustrated in FIG. 5B, a power connection resistance may increase which may lead to a performance degradation of the stacked semiconductor device architecture according to a related embodiment.

Figure 7:
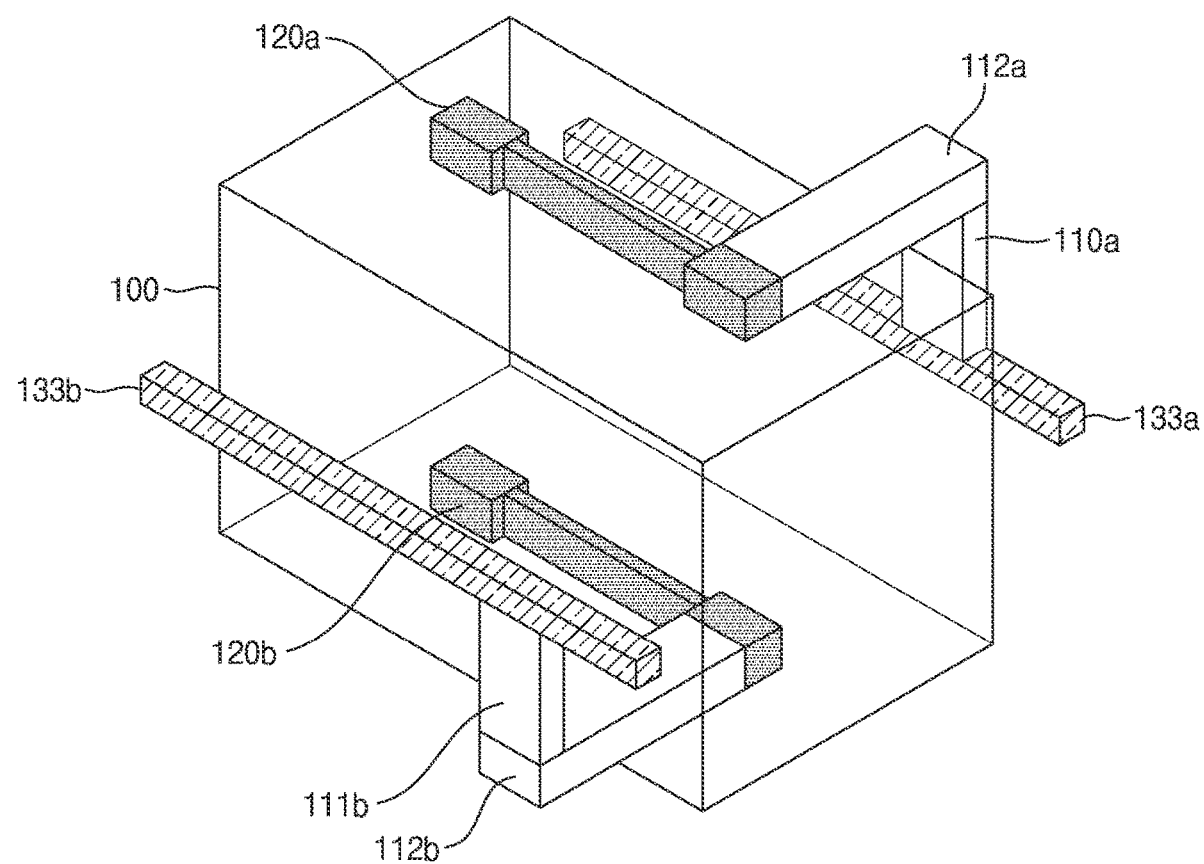
FIG. 7 illustrates a stacked semiconductor device architecture according to an example embodiment.

FIG. 7 illustrates a stacked semiconductor device architecture according to an example embodiment.

Referring to FIG. 7, the stacked semiconductor device architecture 10 according to an example embodiment includes a MOSFET cell including a PMOS 120a provided on a first level of a substrate 100 and an NMOS 120b is provided below the PMOS 120a on a second level of the substrate 100. However, embodiments are not limited thereto. For example, the PMOS 120a may be provided at the second level and the NMOS 120b may be provided at a first level.

A horizontal interconnect 112a is connected to the PMOS 120a. The horizontal interconnect 112a may be connected to an epitaxial layer of the PMOS 120a. A bottom vertical contact 110a is provided on a lower surface of the horizontal interconnect 112a and extends downwards to a level between the PMOS 120a and the NMOS 120b in a vertical direction. However, embodiments are not limited thereto. For example, a bottom vertical contact 110a may be provided on the PMOS 120a. A middle power rail 133a configured to supply power to the PMOS 120a is provided on a lower surface of the bottom vertical contact 110a. The middle power rail 133a is provided at a vertical level between the PMOS 120a and the NMOS 120b, and is not provided at a same vertical level of as the PMOS 120a and the NMOS 120b.

The NMOS 120b is connected to a horizontal interconnect 112b. The horizontal interconnect 112b may be connected to an epitaxial layer of the NMOS 120b. A top vertical contact 111b is provided on an upper surface of the horizontal interconnect 112b. However, embodiments are not limited thereto. For example, a top vertical contact 111b may be provided on the NMOS 120b. Another middle power rail 133b is provided on an upper surface of the top vertical contact 111b at a vertical level between the PMOS 120a and the NMOS 120b. The middle power rail 133b is provided at a vertical level between the PMOS 120a and the NMOS 120b, and is not provided at a same vertical level of as the PMOS 120a and the NMOS 120b.

The top vertical contact 111b and the bottom vertical contact 110a may include a metal material with a relatively low resistivity such as, for example, tungsten, cobalt, and ruthenium. However, materials of the top vertical contact 111b and the bottom vertical contact 110a are not limited thereto.

As illustrated in FIG. 7, as the middle power rails 133a and 133b are provided at a level between the PMOS 120a and the NMOS 120b included in a MOSFET cell, the height of the top vertical contact 111b and the bottom vertical contact 110a may be less than the height of the top vertical contact 2111b and bottom vertical contact 2110a as illustrated in FIGS. 4A and 4B. The height of the top vertical contact 111b and the bottom vertical contact 110a may be less than a distance between the PMOS 120a and the NMOS 120b in the vertical direction. For example, the top vertical contact 111b and the bottom vertical contact 110a may have a height that is less than around 50 nm. However, embodiments are not limited thereto.

In addition, as the middle power rails 133a and 133b are provided at a vertically different level from the PMOS 120a and the NMOS 120b, stress that may be caused on the PMOS 120a and the NMOS 120b devices by power rails may be reduced compared to a semiconductor architecture in which the power rails are provided on a vertically same level as the PMOS 120a and the NMOS 120b.

As the middle power rails 133a and 133b are provided within the MOSFET cell and at a vertically different level from the metal layers 140, additional space to provide metal layers 140 for signal routing may be available above the PMOS 120a and the NMOS 120b. Such additional space may facilitate manufacturing process of the metal layers 140. In addition, as the middle power rails 133a and 133b are provided at a same or similar vertical level, the manufacturing process may be more simplified.

Figure 8A:
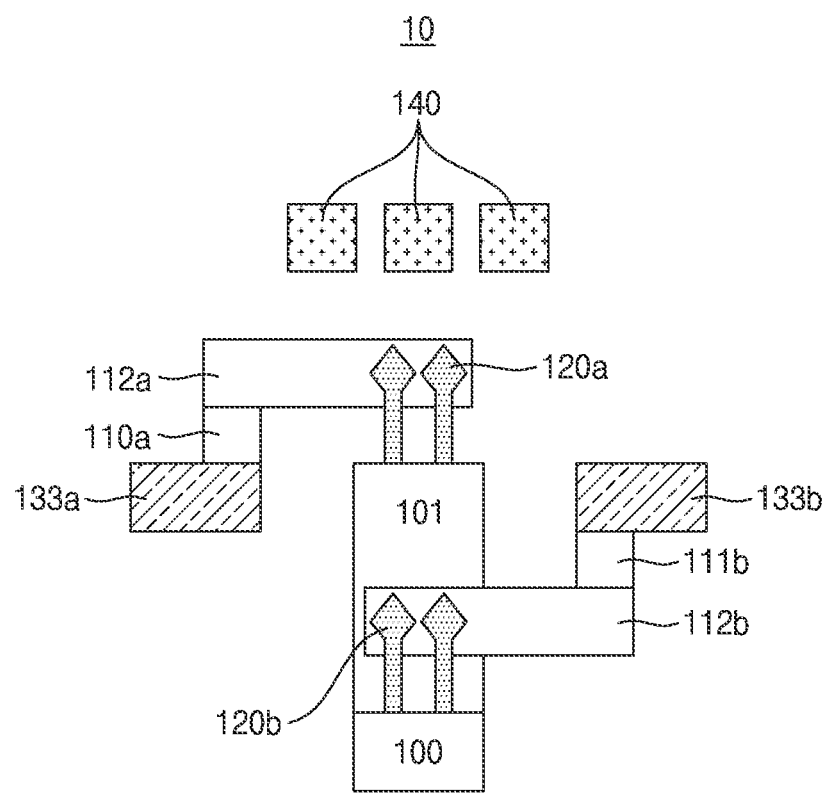
FIG. 8A is a cross-sectional view of the stacked semiconductor device architecture as illustrated in FIG. 7.

FIG. 8A is a cross-sectional view of the stacked semiconductor device architecture as illustrated in FIG. 7.

As illustrated in FIG. 8A, a MOSFET cell includes a PMOS 120a is provided on a first level of a substrate 100 and an NMOS 120b is provided below the PMOS 120a on a second level of the substrate 100. However, embodiments are not limited hereto. For example, the PMOS 120a may be provided at the second level and the NMOS 120b may be provided at a first level. A dielectric layer 101 may be provided between the PMOS 120a and the NMOS 120b.

A horizontal interconnect 112a is connected to the PMOS 120a. The horizontal interconnect 112a may be connected to an epitaxial layer of the PMOS 120a. A bottom vertical contact 110a is provided on a lower surface of the horizontal interconnect 112a and extends downwards to a vertical level between the PMOS 120a and the NMOS 120b. A middle power rail 133a configured to supply power to the PMOS 120a is provided on a lower surface of the bottom vertical contact 110a. The middle power rail 133a is provided at a vertical level between the PMOS 120a and the NMOS 120b, and is not provided as a same vertical level as the PMOS 120a and the NMOS 120b.

The NMOS 120b is connected to a horizontal interconnect 112b. The horizontal interconnect 112b may be connected to an epitaxial layer of the NMOS 120b and extend in a horizontal direction away from the NMOS 120b. A top vertical contact 111b is connected to an upper surface of the horizontal interconnect 112b and extends upwards to a vertical level between the PMOS 120a and the NMOS 120b. Another middle power rail 133b is provided on an upper surface of the top vertical contact 111b at a vertical level between the PMOS 120a and the NMOS 120b, and is not provided as a same vertical level as the PMOS 120a and the NMOS 120b.

In addition, metal layers 140 configured to route signals may be provided at a vertical level above the PMOS 120a and the NMOS 120b.

As illustrated in FIGS. 7 and 8A, the heights of the top vertical contact 111b and the bottom vertical contact 110a are less than the heights of the top vertical contact 2111b and the bottom vertical contact 2110a as illustrated in FIGS. 4A and 4B. Thus, the power connection resistance may be lowered. Further, as the middle power rails 133a and 133b are provided at a level between the PMOS 120a and the NMOS 120b, and do not protrude to a level below or level above the stacked PMOS 120a and NMOS 120b, more space may be available above and below the stacked PMOS 120a and NMOS 120b.

Figure 8B:
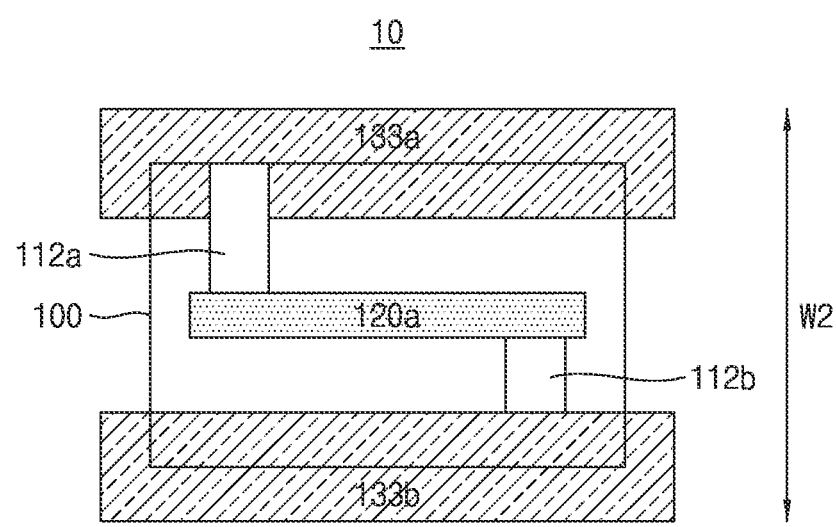
FIG. 8B illustrates a top plan view of the stacked semiconductor device architecture as illustrated in FIG. 7.

FIG. 8B illustrates a top plan view of the stacked semiconductor device architecture as illustrated in FIG. 7.

Referring to FIG. 8B, as the PMOS 120a and the NMOS 120b are stacked in a vertical direction, the width W2 of the stacked semiconductor device architecture 10 according to an example embodiment may be reduced compared to a width W1 of a non-stacked semiconductor device architecture 1000 as illustrated in FIG. 3. As illustrated in FIG. 8B, the PMOS 120a and NMOS 120b are stacked to overlap each other in a vertical direction.

Figure 9:
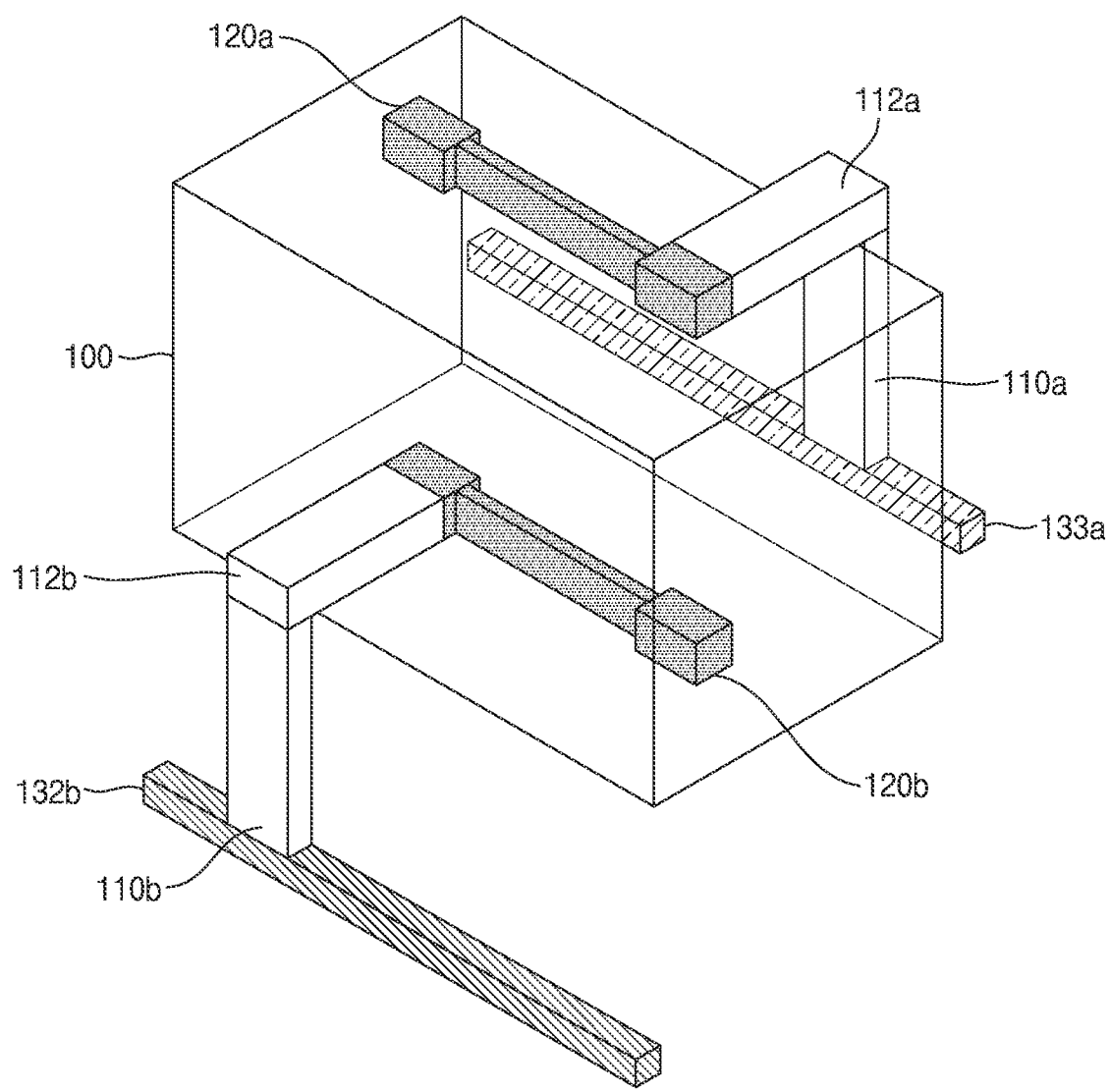
FIG. 9 illustrates a stacked semiconductor device architecture according to another example embodiment.

FIG. 9 illustrates a stacked semiconductor device architecture according to another example embodiment.

Referring to FIG. 9, the stacked semiconductor device architecture 10' according to another example embodiment includes a PMOS 120a is provided on a first level of a substrate 100 and an NMOS 120b is provided below the PMOS 120a on a second level of the substrate 100. However, embodiments are not limited thereto. For example, the PMOS 120a may be provided at a vertical level that is lower than the NMOS 120b.

A horizontal interconnect 112a is connected to the PMOS 120a. The horizontal interconnect 112a may be connected to an epitaxial layer of the PMOS 120a. A bottom vertical contact 110a is provided on a lower surface of the horizontal interconnect 112a and extends downwards to a vertical level between the PMOS 120a and the NMOS 120b. However, embodiments are not limited thereto. For example, a bottom vertical contact 110a may be provided on the PMOS 120a. A middle power rail 133a configured to supply power to the PMOS 120a is provided on a lower surface of the bottom vertical contact 110a. The middle power rail 133a is provided at a vertical level between the PMOS 120a and the NMOS 120b, and is not provided as a same vertical level as the PMOS 120a and the NMOS 120b.

The NMOS 120b is connected to a horizontal interconnect 112b. The horizontal interconnect 112b may be connected to an epitaxial layer of the NMOS 120b. A bottom vertical contact 110b is connected to a lower surface of the horizontal interconnect 112b and extends downwards. However, embodiments are not limited thereto. For example, the bottom vertical contact 110b may be provided on the NMOS 120b. A bottom power rail 132b configured to supply power to the NMOS 120b is provided on a lower surface of the bottom vertical contact 110b. The bottom power rail 132b is provided at a vertical level lower than the PMOS 120a and the NMOS 120b, and is not provided as a same vertical level as the PMOS 120a and the NMOS 120b. The bottom power rail 132b may be a buried power rail that is buried in the substrate 100.

The bottom vertical contacts 110a and 110b may include a metal material with a relatively low resistivity such as, for example, tungsten, cobalt, and ruthenium. However, materials of the bottom vertical contacts 110a and 110b are not limited thereto.

As illustrated in FIG. 9, as a middle power rail 133a is provided at a level between the PMOS 120a and the NMOS 120b included in a MOSFET cell and a bottom power rail 132b is provided at a vertical level below the NMOS 120b, the height of the bottom vertical contacts 110a and 110b may be less the height of the top vertical contact 2111b and the bottom vertical contact 2110a as illustrated in FIGS. 4A and 4B. The height of the bottom vertical contacts 110a and 110b may be less than a distance between the PMOS 120a and the NMOS 120b in the vertical direction. For example, the bottom vertical contacts 110a and 110b may have a height that is less than around 50 nm. However, embodiments are not limited thereto.

In addition, as the middle power rail 133a and the bottom power rail 132b are provided at vertically different levels from the PMOS 120a and the NMOS 120b, stress that may be caused on the PMOS 120a and the NMOS 120b devices by power rails may be reduced compared to a semiconductor architecture in which the power rails are provided on a vertically same level as the PMOS 120a and the NMOS 120b.

As the middle power rail 133a is provided between the PMOS 120a and the NMOS 120b, and the bottom power rail 132b is provided below the NMOS 120b, additional space to provide metal layers 140 for signal routing may be available above the PMOS 120a and the NMOS 120b. Such additional space may facilitate the manufacturing process of the metal layers 140.

Figure 10A:
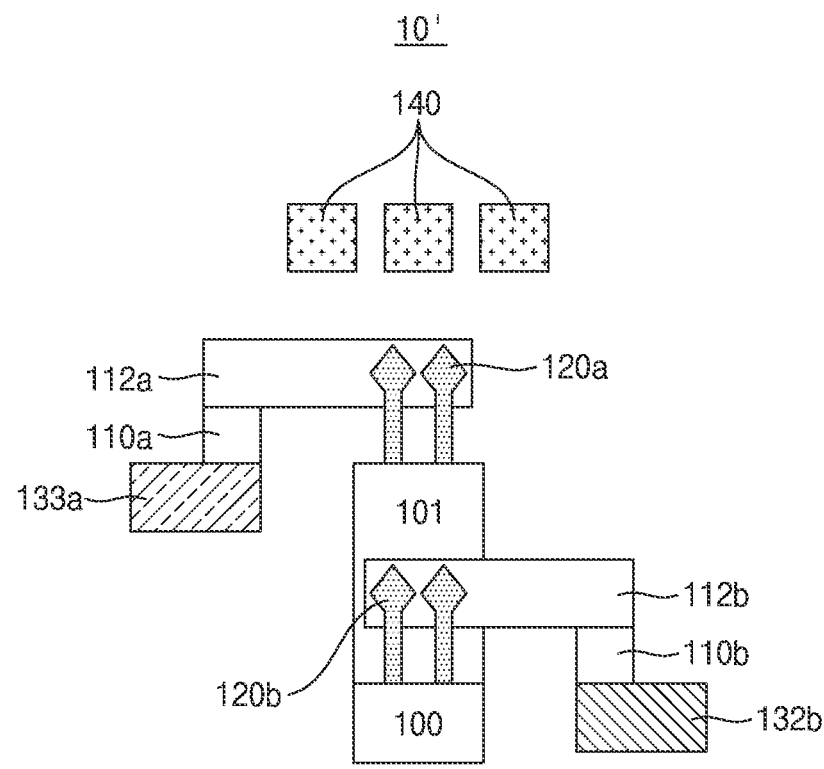
FIG. 10A is a cross-sectional view of the stacked semiconductor device architecture as illustrated in FIG. 9.

FIG. 10A is a cross-sectional view of the stacked semiconductor device architecture as illustrated in FIG. 9.

As illustrated in FIG. 10A, a PMOS 120a is provided on a first level of a substrate 100 and an NMOS 120b is provided on a second level of the substrate 100 that is lower than the first level. However, embodiments are not limited hereto. For example, the PMOS 120a may be provided at the second level and the NMOS 120b may be provided at a first level. A dielectric layer 101 may be provided between the PMOS 120a and the NMOS 120b.

A horizontal interconnect 112a is connected to the PMOS 120a. The horizontal interconnect 112a may be connected to an epitaxial layer of the PMOS 120a. A bottom vertical contact 110a is provided on a lower surface of the horizontal interconnect 112a and extends downwards to a vertical level between the PMOS 120a and the NMOS 120b. A middle power rail 133a configured to supply power to the PMOS 120a is provided on a lower surface of the bottom vertical contact 110a. The middle power rail 133a is provided at a vertical level between the PMOS 120a and the NMOS 120b, and is not provided as a same vertical level as the PMOS 120a and the NMOS 120b.

The NMOS 120b is connected to a horizontal interconnect 112b. The horizontal interconnect 112b may be connected to an epitaxial layer of the NMOS 120b and extend in a horizontal direction away from the NMOS 120b. A bottom vertical contact 110b is connected to a lower surface of the horizontal interconnect 112b and extends downwards to a vertical level below the NMOS 120b. A bottom power rail 132b configured to supply power to the NMOS 120b is provided on a lower surface of the bottom vertical contact 110b. The bottom power rail 132b is provided at a vertical level below the PMOS 120a and the NMOS 120b, and not provided on a same vertical level as the PMOS 120a and the NMOS 120b.

In addition, metal layers 140 configured to route signals may be provided at a vertical level above the PMOS 120a and the NMOS 120b.

As illustrated in FIGS. 9 and 10A, the heights of the bottom vertical contacts 110a and 110b are less than the height of the top vertical contact 2111b and the height of the bottom vertical contact 2110a as illustrated in FIGS. 4A and 4B. For example, the height of the bottom vertical contacts 110a and 110b may be less than around 50 nm. However, embodiments are not limited thereto.

As the heights of the bottom vertical contacts 110a and 110b are reduced, the power connection resistance may be reduced. Further, as the middle power rail 133a and bottom power rail 132b are provided within or below the PMOS 120a and the NMOS 120b in a vertical direction, additional space to provide metal layers 140 for signal routing may be available above the PMOS 120a and the NMOS 120b. Such additional space may facilitate the manufacturing process of the metal layers 140.

Figure 10B:
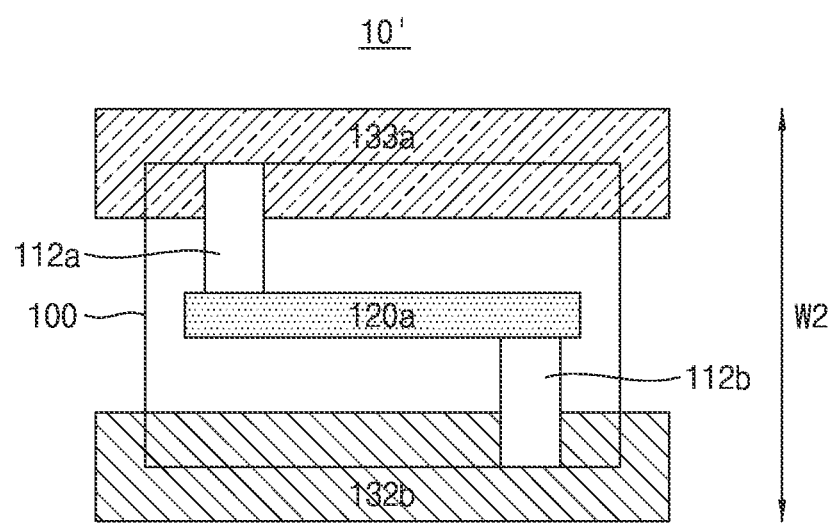
FIG. 10B illustrates a top plan view of the stacked semiconductor device architecture as illustrated in FIG. 9.

FIG. 10B illustrates a top plan view of the stacked semiconductor device architecture as illustrated in FIG. 9.

Referring to FIG. 10B, as the PMOS 120a and the NMOS 120b are stacked in a vertical direction, the width W2 of the stacked semiconductor device architecture 10' may be reduced compared to a width W1 of a non-stacked semiconductor device architecture 1000 as illustrated in FIG. 3. In FIG. 10B the PMOS 120a and NMOS 120b are illustrated as being provided at different locations in a horizontal direction. However, embodiments are not limited thereto, and the PMOS 120a and the NMOS 120b may be stacked to overlap each other in a vertical direction as illustrated in FIG. 10A.

Figure 11:
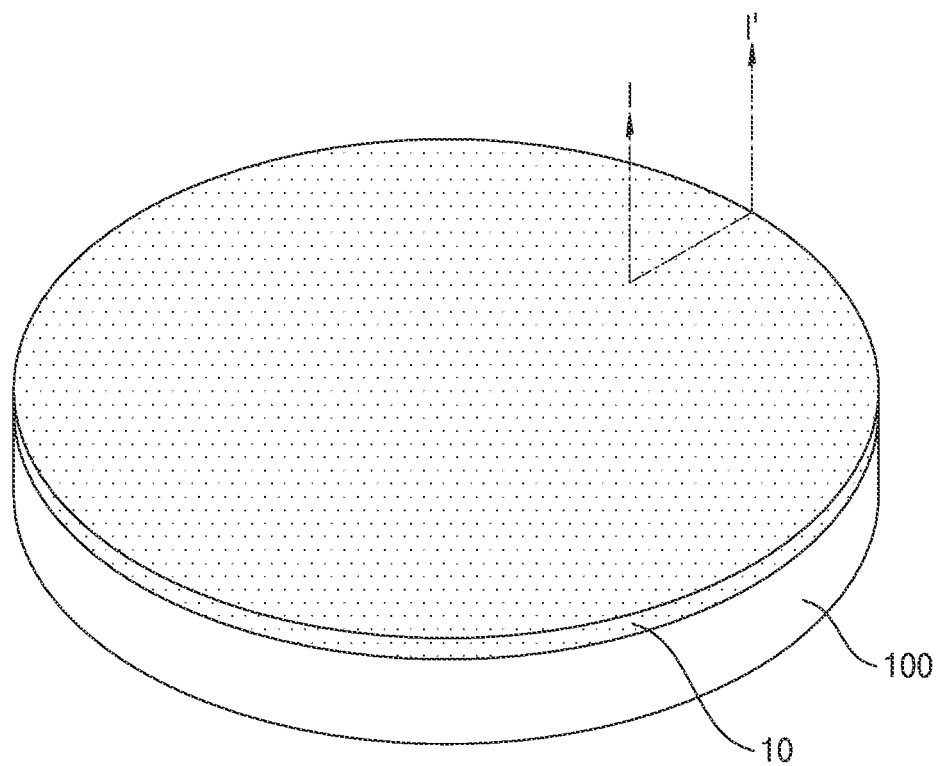
FIG. 11 illustrates a perspective view of a stacked semiconductor device architecture according to example embodiments.

FIG. 11 illustrates a perspective view of a stacked semiconductor device architecture according to example embodiments.

As illustrated in FIG. 11, a semiconductor device architecture may include a substrate 100 and a stacked semiconductor device architecture 10 provided on a first surface of the substrate 100. The stacked semiconductor device architecture 10 may incorporate the stacked semiconductor device architecture according to example embodiments. For example, FIGS. 8A and 10A may be cross-sectional views taken along line I-I' of FIG. 11.

The substrate 100 may be a wafer including, for example, a Si substrate, a glass substrate, a sapphire substrate, etc. However, embodiments are not limited thereto. As illustrated in FIG. 11, the substrate 100 may be a circular panel, but the shape of the substrate 100 is not limited thereto. For example, the substrate 100 may be a tetragonal panel. The substrate 100 may include a single layer or multiple layers.

Figure 12:
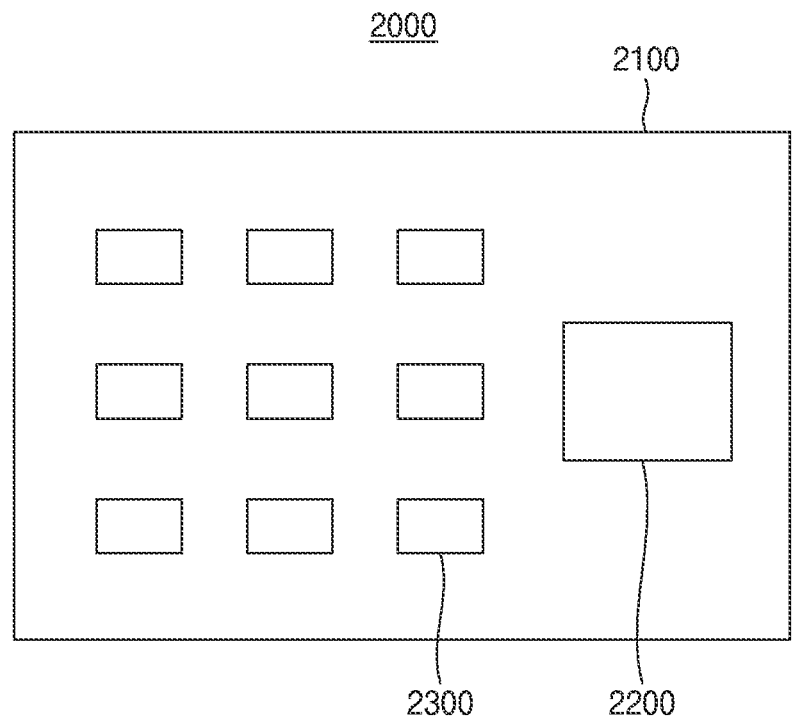
FIG. 12 illustrates a semiconductor device that may incorporate the stacked semiconductor device architectures according to example embodiments.

FIG. 12 illustrates a semiconductor device that may incorporate the stacked semiconductor device architectures according to example embodiments.

Referring to FIG. 12, a semiconductor package 200 according to an example embodiment may include a processor 2200 and semiconductor devices 2300 that are mounted on a substrate 2100. The processor 2200 and/or the semiconductor devices 2300 may include one or more of the stacked semiconductor device architecture described in the above example embodiments.

Figure 13:
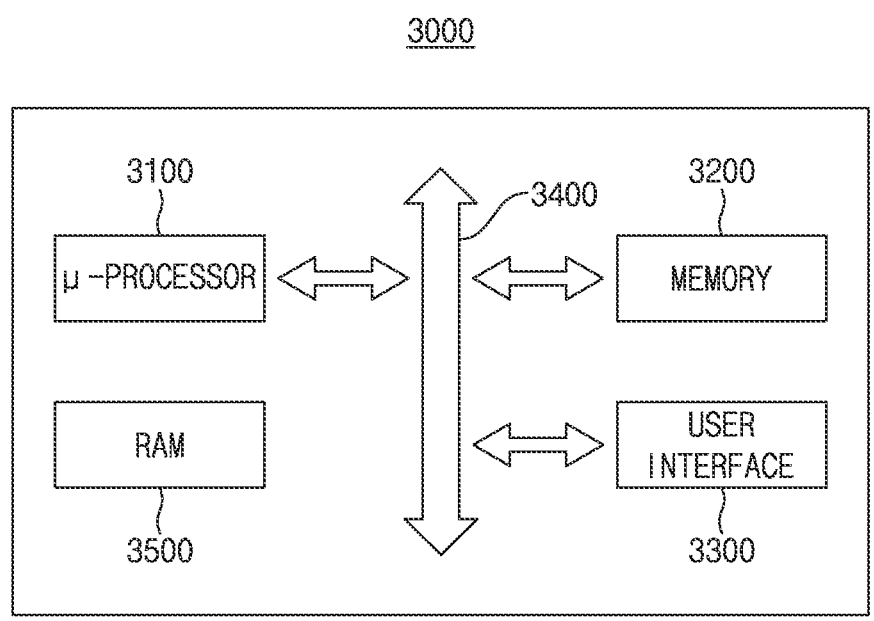
FIG. 13 illustrates a schematic block diagram of an electronic system according to an example embodiment.

FIG. 13 illustrates a schematic block diagram of an electronic system according to an example embodiment.

Referring to FIG. 13, an electronic system 3000 in accordance with an embodiment may include a microprocessor 3100, a memory 3200, and a user interface 3300 that perform data communication using a bus 3400. The microprocessor 3100 may include a central processing unit (CPU) or an application processor (AP). The electronic system 3000 may further include a random access memory (RAM) 3500 in direct communication with the microprocessor 3100. The microprocessor 3100 and/or the RAM 3500 may be implemented in a single module or package. The user interface 3300 may be used to input data to the electronic system 3000, or output data from the electronic system 3000. For example, the user interface 3300 may include a keyboard, a touch pad, a touch screen, a mouse, a scanner, a voice detector, a liquid crystal display (LCD), a micro light-emitting device (LED), an organic light-emitting diode (OLED) device, an active-matrix light-emitting diode (AMOLED) device, a printer, a lighting, or various other input/output devices without limitation. The memory 3200 may store operational codes of the microprocessor 3100, data processed by the microprocessor 3100, or data received from an external device. The memory 3200 may include a memory controller, a hard disk, or a solid state drive (SSD).

At least the microprocessor 3100, the memory 3200 and/or the RAM 3500 in the electronic system 3000 may include stacked semiconductor device architecture as described in the above example embodiments.

It should be understood that example embodiments described herein should be considered in a descriptive sense only and not for purposes of limitation. Descriptions of features or aspects within each example embodiment should typically be considered as available for other similar features or aspects in other embodiments.

While example embodiments have been described with reference to the figures, it will be understood by those of ordinary skill in the art that various changes in form and details may be made therein without departing from the spirit and scope as defined by the following claims.

What is claimed is:

1. A semiconductor architecture having a metal-oxide-semiconductor field-effect transistor (MOSFET) cell comprising a p-type metal-oxide semiconductor (PMOS) device and an n-type metal-oxide semiconductor (NMOS) device, the semiconductor architecture comprising:
    a substrate;
    a first semiconductor device provided on the substrate, the first semiconductor device being the NMOS device;
    a second semiconductor device provided on the substrate, the second semiconductor device being the PMOS device below the first semiconductor device, the second semiconductor device being the closest PMOS device to the first semiconductor device;
    a first power rail configured to supply power to the first semiconductor device; and
    a second power rail configured to supply power to the second semiconductor device,
    wherein at least one of the first power rail and the second power rail is provided at a vertical level between the first semiconductor device and the second semiconductor device.

2. The semiconductor architecture according to claim 1, further comprising:
    a first vertical contact provided on the first semiconductor device; and
    a second vertical contact provided on the second semiconductor device.

3. The semiconductor architecture according to claim 2, wherein the first power rail is provided on the first vertical contact, and
    wherein the second power rail is provided on the second vertical contact.

4. The semiconductor architecture according to claim 3, wherein the first vertical contact extends downward to the vertical level between the first semiconductor device and the second semiconductor device.

5. The semiconductor architecture according to claim 4, wherein the second vertical contact extends upward to the vertical level between the first semiconductor device and the second semiconductor device.

6. The semiconductor architecture according to claim 5, wherein the first power rail and the second power rail are provided at the vertical level between the first semiconductor device and the second semiconductor device.

7. The semiconductor architecture according to claim 6, further comprising:
    at least one metal layer provided above the PMOS device and the NMOS device.

8. The semiconductor architecture according to claim 4, wherein the second vertical contact extends downward to a lower level below the first semiconductor device and the second semiconductor device.

9. The semiconductor architecture according to claim 8, wherein the first power rail is provided at the vertical level between the first semiconductor device and the second semiconductor device, and
    wherein the second power rail is provided at the lower level below the first semiconductor device and the second semiconductor device.

10. The semiconductor architecture according to claim 9, wherein the second power rail is a buried power rail that is buried in the substrate.

11. The semiconductor architecture according to claim 2, wherein a height of the first vertical contact is less than a vertical distance between the first semiconductor device and the second semiconductor device, and a height of the second vertical contact is less than the vertical distance between the first semiconductor device and the second semiconductor device.

12. A semiconductor architecture having a metal oxide-semiconductor field-effect transistor (MOSFET) cell comprising a p-type metal-oxide semiconductor (PMOS) device and an n-type metal-oxide semiconductor (NMOS) device, the semiconductor architecture comprising:
   a wafer;
   the PMOS device being provided on the wafer;
   the NMOS device being provided at a vertical level different from the PMOS device, NMOS device being the closest NMOS device to the PMOS device;
   a first power rail configured to supply power to the PMOS device; and
   a second power rail configured to supply power to the NMOS device,
   wherein the PMOS device and the NMOS device are included in the MOSFET cell, and
   wherein at least one of the first power rail and the second power rail is provided at a vertical level between the PMOS device and the NMOS device.

13. The semiconductor architecture according to claim 12, wherein the first power rail is connected to the PMOS device through a first vertical contact, and
   wherein the second power rail is connected to the NMOS device through a second vertical contact.

14. The semiconductor architecture according to claim 13, wherein a height of the first vertical contact is less than a vertical distance between the PMOS device and the NMOS device, and a height of the second vertical contact is less than the vertical distance between the PMOS device and the NMOS device.

15. The semiconductor architecture according to claim 12, wherein both of the first power rail and the second power rail are provided at the vertical level between the PMOS device and the NMOS device.

16. The semiconductor architecture according to claim 12, wherein one of the first power rail and the second power rail is provided below the PMOS device and the NMOS device in a vertical direction.

17. The semiconductor architecture according to claim 16, wherein the one of the first power rail and the second power rail being provided below the PMOS device and the NMOS device is a buried power rail that is buried in the wafer.

18. A semiconductor architecture having a metal oxide-semiconductor field-effect transistor (MOSFET) cell comprising a p-type metal-oxide semiconductor (PMOS) device and an n-type metal-oxide semiconductor (NMOS) device, the semiconductor architecture comprising:
   a first semiconductor device included in the MOSFET cell being the NMOS device;
   a second semiconductor device included in the MOSFET cell being the PMOS device above the first semiconductor device, the second semiconductor device being the closest PMOS device to the first semiconductor device;
   a first power rail configured to supply power to the PMOS device, the first power rail being provided at a vertical level between the PMOS device and the NMOS device; and
   a second power rail configured to supply power to the NMOS device, the second power rail being provided at a vertical level different from the PMOS device and the NMOS device.

* * * * *